United States Patent
Ochi et al.

[11] Patent Number: 5,907,161
[45] Date of Patent: May 25, 1999

[54] SEMICONDUCTOR DEVICE INCLUDING DOPED SPONTANEOUSLY FORMED SUPERLATTICE LAYER

[75] Inventors: Seiji Ochi; Tatuya Kimura, both of Itami, Japan

[73] Assignee: Mitsubishi Denki Kabushikikaisha, Tokyo, Japan

[21] Appl. No.: 09/017,422

[22] Filed: Feb. 2, 1998

Related U.S. Application Data

[62] Division of application No. 08/536,942, Sep. 29, 1995, Pat. No. 5,818,073.

[30] Foreign Application Priority Data

Oct. 19, 1994 [JP] Japan .................................. 6-253630

[51] Int. Cl.⁶ .............................................. H01L 31/0328
[52] U.S. Cl. .............................. 257/94; 257/18; 257/192
[58] Field of Search .................................. 257/18, 192, 94

[56] References Cited

U.S. PATENT DOCUMENTS

| | | | |
|---|---|---|---|
| 5,034,957 | 7/1991 | Ohba et al. | 372/45 |
| 5,065,402 | 11/1991 | Kawano | 372/46 |
| 5,173,913 | 12/1992 | Kaneno | 372/46 |
| 5,373,167 | 12/1994 | Lee et al. | 257/22 |
| 5,490,159 | 2/1996 | Ochi et al. | 372/43 |
| 5,521,404 | 5/1996 | Kikkawa et al. | 257/18 |
| 5,556,804 | 9/1996 | Nagai | 437/129 |
| 5,561,080 | 10/1996 | Ishibashi et al. | 437/129 |
| 5,596,591 | 1/1997 | Kawano | 372/46 |
| 5,751,028 | 5/1998 | Kikkawa | 257/192 |
| 5,818,073 | 10/1998 | Ochi et al. | 257/15 |

OTHER PUBLICATIONS

Fukui et al., "(AlAs)$_{0.5}$ (GaAs)$_{0.5}$ Fractional–Layer Superlattices Grown On (001) Vicinal Surfaces By Metalorganic Chemical Vapor Deposition", Applied Physics Letters, vol. 50, No. 13, 1987, pp. 824–836.

Gomyo et al., "Evidence For The Existence Of An Ordered State In Ga$_{0.5}$In$_{0.5}$P Grown by Metalorganic Vapor Phase Epitaxy And Its Relation to Band–Gap Energy", Applied Physics Letters, vol. 50, No. 11, 1987, pp. 673–675.

Kurimoto et al., "Electronic Structure Of The (GaP)$_1$(InP)$_1$ (111) Strained–Layer Superlattice", Physical Review B, vol. 40, No. 6, 1989, pp. 3889–3895.

Horner et al., "Photoluminescence–Excitation–Spectroscopy Studies In Spontaneously Ordered GaInP$_2$", Physical Review B, vol. 47, No. 7, 1993 pp. 4041–4043.

Zachai, "Si/Ge Superlattices For Optical Applications: Possibilities, Problems, And Prospects", Material Research Society, vol. 220, 1991, pp. 311–320.

Pearah et al., "Strained Ga$_x$In$_{1-x}$P Multiple Quantum Wire Light–Emitting Diodes: A Luminescence Polarization Study", Applied Physics Letters, vol. 62, No. 7, 1993, pp. 729–731.

Gomyo et al., "Band–Gap Energy Anomaly And Observation Of New–Typw Natural Superlattice In AlInAs Grown By GSMBE", Extended Abstracts of Japan Society of Applied Physics, Autumn Meeting, 1993.

*Primary Examiner*—David B. Hardy
*Attorney, Agent, or Firm*—Leydig, Voit & Mayer

[57] ABSTRACT

A semiconductor device includes a III-V compound semiconductor layer including two or more Group III elements and containing dopant impurities, including a spontaneous superlattice, and having a stripe shape with two ends, and electrodes disposed on the ends of the stripe shaped semiconductor layer to form a resistor element. Because of the spontaneous superlattice, electrons are one-dimensionally confined within the III-V compound semiconductor layer, i.e., the electrons flow easier in the direction perpendicular to the periodic direction of the spontaneous superlattice than in the direction parallel to it, resulting in anisotropic electrical resistivity. Therefore, the orientation of the resistor element with respect to the periodic direction of the spontaneous superlattice becomes another factor in determining the resistance of the resistor element. In particular, resistances of the resistor elements of identical stripe shape can be made considerably different from each other, if one is perpendicular to the periodic direction of the spontaneous superlattice and another is parallel to it.

2 Claims, 10 Drawing Sheets

E : Energy of electron
k : Momentum

E : Energy of electron
k : Momentum

E : Energy of electron
k : Momentum

E : Energy of electron
k : Momentum

E : Energy of electron
k : Momentum

Fig.16 (a)
Fig.16 (b)
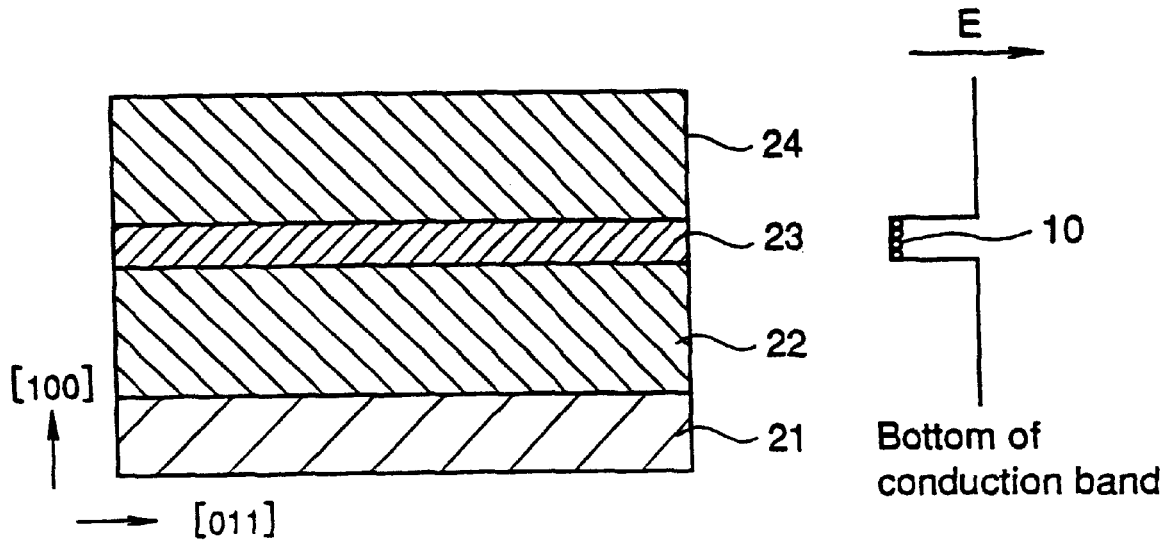
Fig.17
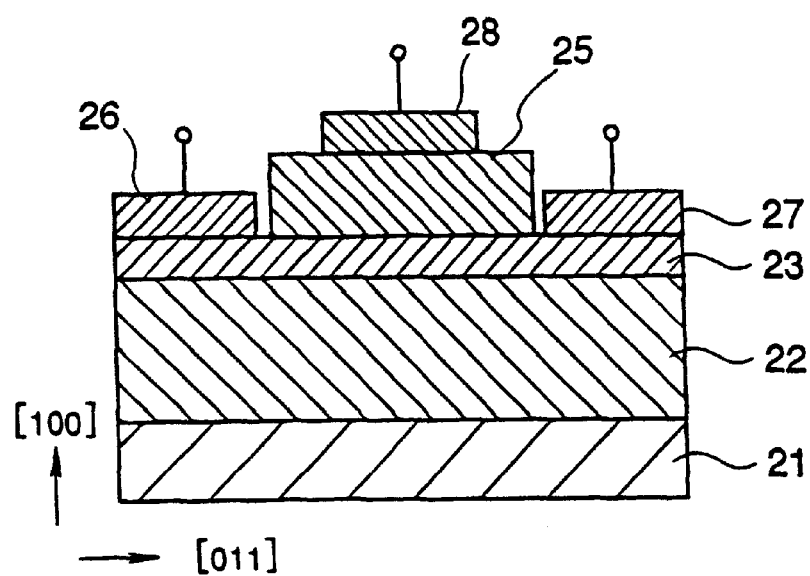

SEMICONDUCTOR DEVICE INCLUDING DOPED SPONTANEOUSLY FORMED SUPERLATTICE LAYER

This application is a Divisional of application Ser. No. 08/536,942 filed Sep. 29, 1995, now U.S. Pat. No. 5,818,073.

FIELD OF THE INVENTION

The present invention relates to a structure of a semiconductor device and, more particularly, to a structure of a semiconductor device including a semiconductor layer comprising III-V compound semiconductor materials.

BACKGROUND OF THE INVENTION

FIG. 19 is a cross-sectional view illustrating a resistor element of a prior art semiconductor device. In the figure, reference numeral 101 designates a semi-insulating GaAs substrate, reference numeral 103 designates a stripe-shaped resistor region having a prescribed width and length at the surface of the semi-insulating GaAs substrate 101, and reference numerals 102a and 102b designate electrodes comprising metal (terminals).

The method of fabricating a resistor element of a prior art semiconductor device will be described. First, the region of the surface of the semi-insulating GaAs substrate 101 where the resistor region 103 is to be formed is ion-implanted with dopant impurities using a photoresist (not shown in the figure) as a mask. Then, annealing is performed to electrically activate the implanted ions, thereby forming the stripe-shaped resistor region 103 having a prescribed width. Furthermore, the electrodes 102a and 102b are disposed on both ends of the stripe-shaped resistor region 103 preferably by evaporation, thereby completing the resistor element.

In the prior art semiconductor device, the electrodes 102a and 102b are connected to electrodes of other circuit elements with lines or the like to make use of the resistor region 103 as a resistor element, and the resistance is determined by the quantity of ions implanted into the resistor region, the width and the length of the resistor region, and the like.

If the quantity of ions implanted is constant, the resistivity of the resistor element is constant. Since there is a limit to changing widths, lengths, and the like, within the limited area of a chip or the like, it is extremely difficult to form multiple resistor elements with resistances that differ considerably, by a factor of a hundred, for example, on the chip in a single ion implantation step. Although it is possible to change the resistivity of the resistor element by changing the quantity of ions implanted, thereby changing the resistance, it would, however, be necessary in this case to perform multiple implantation steps, which would complicate processing.

On the other hand, a semiconductor device having a structure including a one-dimensional carrier distribution has been proposed, and research aimed at its realization has been conducted. FIG. 20 is a cross-sectional view illustrating a structure of a high electron mobility transistor as an example of a prior art semiconductor device having this one-dimensional carrier distribution. In the figure, reference numeral 111 designates a semi-insulating GaAs substrate the surface of which is tilted from the (100) surface by a prescribed angle so that atomic steps, i.e., steps with a height corresponding to a single atom, are formed on its surface. Reference numerals 112 and 114 designate an AlGaAs layer, reference numeral 113 designates a one-dimensional electron channel layer, reference numeral 115 designates a gate electrode, reference numeral 106 designates a source electrode, and reference numeral 117 designates a drain electrode.

FIGS. 21(a)–21(e) are views illustrating a method of fabricating the high electron mobility transistor shown in FIG. 20. In the figures, the same reference numerals used in FIG. 20 designate the same or corresponding parts. Reference numeral 118 designates an AlAs layer, reference numeral 119 designates a GaAs layer, and reference numeral 120 designates atomic steps. FIG. 21(a) is a view illustrating a cross-section of the high electron mobility transistor of FIG. 20 sectioned perpendicular to the gate length direction. FIGS. 21(b)–21(e) are views magnifying the surface of the AlGaAs layer 112 of FIG. 21(a).

A fabricating method will be described. First, as shown in FIG. 21(a), the semi-insulating GaAs substrate 111 is held tilted from the (100) surface by a prescribed angle (several degrees), and the AlGaAs layer 112 is grown on the GaAs substrate 111, preferably by metal organic chemical vapor deposition (MOCVD). During this process, as shown in FIG. 21(b), the multiple atomic steps 120, which are separated by the same distance from each other and are parallel, are formed on the surface of the AlGaAs' layer 112 along the line where the surface of the AlGaAs layer 112 and the (100) surface intersect.

The AlAs layers 118 are grown at the atomic steps 120 by "step flow growth" described in Applied Physics Letters, Volume 50, Page 824 (1987). The "step flow growth" mechanism is a process of crystal growth of an atomic layer along an atomic step of a semiconductor substrate crystal layer in which atoms supplied to the semiconductor substrate layer diffuse along the surface and become attached with priority to the atomic steps. In the present case, the AlAs layers 118 are grown by a single atomic layer along the atomic steps 120 until the width becomes half the distance between two neighboring atomic steps (FIG. 21(c)). The GaAs layers 119 are grown next to the AlAs layer 118 by the step flow growth mechanism until they reach the neighboring atomic step 120 (FIG. 21(d)). This step flow growth, as shown in FIG. 21(e), is repeated a number of times so that the AlAs layer and the GaAs layer are stacked on the AlAs layer 118 and the GaAs layer 119, respectively, thereby forming the one-dimensional channel layer 113.

The AlGaAs layer 114 is formed on the one-dimensional layer 113. The openings for forming the source electrode 106 and the drain electrode 117 are formed by etching the AlGaAs layer 114 along the direction in which the atomic steps 120 extend. The source electrode 106 and the drain electrode 117 are formed at the portions of the one-dimensional conduction layer 113 which are exposed by the etching step. The gate electrode 115 is formed on the AlGaAs layer 114 at a mid-point between the source electrode 106 and the drain electrode 117, preferably by evaporation, thereby completing a high electron mobility transistor having the source electrode 106, the gate electrode 115, and the drain electrode 117 along the direction in which the atomic steps 120 extend as shown in FIG. 20.

In the prior art high electron mobility transistor described above, the multiple AlAs layers 118 which have a stripe shape and extend along the direction in which the atomic steps 120 extend are formed within the one-dimensional channel layer 113. The band gap energy of the AlAs layer 118 is smaller than both the band gap energy of the neighboring GaAs layer 119 and the band gap energies of the AlGaAs layer 112 and the AlGaAs layer 114 which sandwich the AlAs layers 118. Therefore, the electrons are confined in the AlAs layers 118 in a one-dimensional state. By forming the source electrode 106 and the drain electrode 117 along the stripe direction of the AlAs layer 118, the AlAs layer 118 can be used as a one-dimensional electron channel, and this makes it possible to drive the electrons at high speed, thereby operating the high electron mobility transistor at high speed.

However, in the prior art high electron mobility transistor, as described above, it is necessary to perform the step flow growth repeatedly when the AlAs layers 118 and the GaAs layers 119, which form the one-dimensional layer 113, are formed, making the fabricating process extremely complicated. Furthermore, in order to stack the AlAs layers 118 with high precision, exact control of the step flow growth is necessary, requiring an expensive growth facility having a high degree of controllability.

As described above, the resistivities are the same for resistor elements that are formed through the same processes in the prior art semiconductor device. Therefore, it is extremely difficult to simultaneously form multiple resistor elements having considerably different resistances in a single chip. In order to form multiple resistor elements having considerably different resistances in a single chip, it is necessary to form the resistor elements through multiple processes, complicating fabrication of a semiconductor device.

Furthermore, in the prior art semiconductor device, in order to form a structure that can produce a one-dimensional carrier distribution that is effective in improving characteristics of the semiconductor device, it is necessary to use step flow growth or the like. This step flow growth considerably complicates the fabricating process and it is difficult to improve the productivity of the semiconductor device to a practical level.

SUMMARY OF THE INVENTION

It is an object of the present invention to provide a semiconductor device having a structure that enables easily producing multiple resistor elements having considerably different resistances in a single chip.

It is another object of the present invention to provide a semiconductor device having a structure that enables easily forming a one-dimensional carrier distribution.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor device comprises a semiconductor substrate having a main surface; a III-V compound semiconductor layer including two or more Group III elements and containing dopant impurities, having a surface, disposed on the main surface of the semiconductor substrate, the semiconductor layer including a spontaneous superlattice, and having a stripe shape with two ends; and electrodes disposed on both ends of the stripe-shaped semiconductor layer, respectively, so that the III-V compound semiconductor layer and the electrodes form a resistor element. Therefore, the III-V compound semiconductor layer having a stripe shape is anisotropic in resistivity parallel to the surface of the semiconductor substrate. By changing the direction in which the stripe-shaped III-V compound semiconductor layer is positioned and by changing the configuration of the stripe-shaped III-V compound semiconductor layer, the resistivity of the resistor element can be considerably changed and multiple resistor elements having considerably different resistances can be formed in a single process.

According to a second aspect of the present invention, in the semiconductor device, the III-V compound semiconductor layer contains dopant impurities in such an amount that the Fermi level comes within the band gap energy between mini-bands created in a periodic direction of the spontaneous superlattice. Therefore, by changing the direction in which the stripe-shaped III-V compound semiconductor layer is positioned and by changing the configuration of the stripe-shaped III-V compound semiconductor layer, the resistivity of the resistor element can be considerably changed and multiple resistor elements having considerably different resistances can be formed in a single process.

According to a third aspect of the present invention, the semiconductor device includes a plurality of resistor elements are formed, and at least one of these resistor elements has a configuration in which the III-V group compound semiconductor layer extends in a direction different from those of other resistor elements on a surface parallel to the main surface of the semiconductor substrate. Multiple resistor elements having considerably different resistances can be formed in a single process.

According to a fourth aspect of the present invention, in the semiconductor device including a plurality of resistor elements, at least one resistor element has a straight line shape in which the III-V compound semiconductor of the resistor element layer extends in a direction parallel to a periodic direction of the spontaneous superlattice on a surface parallel to the surface of the semiconductor substrate, and another resistor element of the remaining resistor elements has a straight line shape in which the III-V compound semiconductor layer extends in a direction perpendicular to a periodic direction of the spontaneous superlattice on a surface parallel to the main surface of the semiconductor substrate. The resistivity of the resistor element that extends parallel to the periodic direction of the spontaneous superlattice can be maximized in comparison with the resistivity of the resistor element that extends perpendicular to the periodic direction of the spontaneous superlattice.

According to a fifth aspect of the present invention, in the semiconductor device, the III-V compound semiconductor layer of the resistor element is bent into an L-shape at a prescribed location on a surface parallel to the main surface of the semiconductor substrate. By changing the lengths of the two sides of the L-shaped III-V group compound semiconductor layer, the resistance of the resistor element can be considerably changed.

According to a sixth aspect of the present invention, in the semiconductor device, the III-V compound semiconductor layer of the resistor element is diagonally positioned so that it makes a prescribed angle on a surface parallel to the main surface of the semiconductor substrate with the periodic direction of the spontaneous superlattice. The resistivity of the resistor element can be considerably changed in accordance with the angle made with the periodic direction of the spontaneous superlattice.

According to a seventh aspect of the present invention, a semiconductor device comprises a first semiconductor layer having a main surface; a III-V group compound semiconductor layer including two or more Group III elements and containing dopant impurities, having a surface, disposed on the main surface of the first semiconductor layer, the semiconductor layer having a band gap energy smaller than that of the first semiconductor layer, and including a spontaneous superlattice; a source electrode and a drain electrode disposed along a line of a periodic direction of the spontaneous superlattice on a surface parallel to the main surface of the first semiconductor layer within the III-V compound semiconductor layer, making ohmic contact with the III-V compound semiconductor layer; and a gate electrode disposed on the III-V compound semiconductor layer between the source electrode and the drain electrode with an insulating film between the gate electrode and the III-V compound semiconductor layer. By applying a gate voltage to the gate electrode, the current flowing between the source electrode and the drain electrode is successively opened, closed, and opened in response to increasing gate bias, and this switching of the current can be very rapid.

According to an eighth aspect of the present invention, a semiconductor device comprises a first semiconductor layer having a main surface; a III-V compound semiconductor layer including two or more Group III elements and containing dopant impurities, having a surface, disposed on the main surface of the first semiconductor layer, the semiconductor layer having a band gap energy smaller than that of the first semiconductor layer, and including a spontaneous superlattice; and a second semiconductor layer disposed on the surface of the III-V compound semiconductor layer and having a band gap energy larger than that of the III-V compound semiconductor layer. The III-V compound semiconductor layer is anisotropic in resistivity on a surface parallel to the main surface of the first semiconductor layer, and charge carriers are confined two-dimensionally in the III-V compound semiconductor layer by the first and second semiconductor layers. The spontaneous superlattice confines the carriers in a prescribed direction on a surface parallel to the main surface of the first semiconductor layer within the III-V compound semiconductor layer. A one-dimensional carrier distribution can easily be formed in the III-V compound semiconductor layer without using a complicated fabricating method.

According to a ninth aspect of the present invention, in the semiconductor device, the III-V compound semiconductor layer contains dopant impurities in such an amount that the Fermi level is within the energy band gap between minibands created in a periodic direction of the spontaneous superlattice of the III-V compound semiconductor layer. One-dimensional carrier distribution can easily be achieved in the III-V compound semiconductor layer.

According to a tenth aspect of the present invention, the semiconductor device further comprises a source electrode and a drain electrode disposed along a line in a direction perpendicular to the periodic direction of the spontaneous superlattice on a surface parallel to the main surface of the first semiconductor layer within the III-V compound semiconductor, making ohmic contact with the III-V compound semiconductor layer; and a gate electrode disposed on the second semiconductor layer between the source electrode and the drain electrode. One-dimensional carrier distribution in a direction parallel to the aligning direction of the source and the drain electrodes can easily be achieved in the III-V compound semiconductor layer, and a semiconductor device capable of high speed carrier transport can easily be produced.

According to an eleventh aspect of the present invention, in the semiconductor device, the first semiconductor layer and the second semiconductor layer have mutually different conductivity types; the III-V compound semiconductor layer is an active layer; and the first semiconductor layer, the second semiconductor layer, and the III-V compound semiconductor layer form a double heterojunction structure, the III-V compound semiconductor layer being the active layer so that the semiconductor device is a semiconductor laser. A one-dimensional carrier distribution can easily be achieved in the III-V compound semiconductor layer, and a semiconductor device of superior characteristics can easily be produced.

BRIEF DESCRIPTION OF THE DRAWINGS

FIG. 16 is a cross-sectional view illustrating a structure of a main portion of a semiconductor device according to a third embodiment of the present invention, and FIG. 16(b) is an energy band diagram in the crystal growth direction of the same semiconductor device.

FIG. 17 is a cross sectional view illustrating a structure of a semiconductor device according to a fourth embodiment of the present invention.

DETAILED DESCRIPTION OF THE PREFERRED EMBODIMENTS

Embodiment 1

Figure 1:
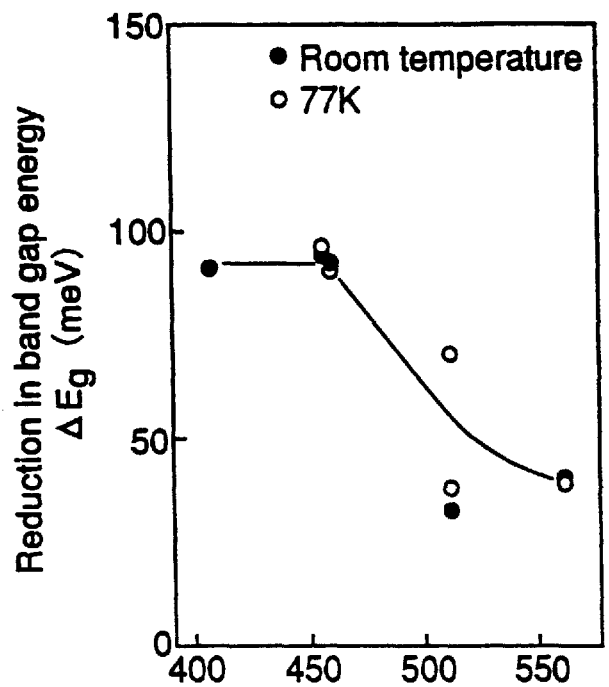
FIG. 1 is a graph illustrating growth temperature dependence of the reduction in band gap energy of an AlInAs layer.

In crystal growth of a compound semiconductor, it is generally known that, when a III-V compound semiconductor having two or more Group III elements is grown by vapor deposition, different Group III elements are periodically arranged in the crystal, forming a spontaneous superlattice. For example, in Applied Physics Letters, Volume 50, Number 11, Page 673–675 (1987), it is illustrated that, when $Ga_{0.5}In_{0.5}P$ is grown on a GaAs substrate by metal organic chemical vapor deposition (MOCVD), a repeating structure, i.e., a spontaneous superlattice structure, appears and the band gap energy (hereinafter referred to as $E_g$ where appropriate) is reduced. The amount of the reduction in $E_g$ varies with growth conditions, such as growth temperature and the ratio of supply of the Group V source material to the Group III source material (V/III ratio). It is postulated that the reduction in energy depends on the degree of regularity of the spontaneous superlattice. For $Ga_{0.5}In_{0.5}P$, the band structure of the (GaP)/(InP)(111) superlattice in which Ga atoms and In atoms are alternately arranged on a (111) surface is calculated in Physical Review B, Volume 40, Number 6, Page 3889 to 3895 (1989), theoretically suggesting the reduction in $E_g$.

The <111> direction includes the <111>A direction and the <111>B direction which are perpendicular to each other. A new periodic structure due to a spontaneous superlattice strongly manifests itself in either the <111>A or <111>B direction. The direction in which this periodic structure appears differs depending on the materials. For example, a periodic structure appears in the <111>A direction in an AlInAs layer and a periodic structure appears in the <111>B direction in an InGaP layer. Usually, a spontaneous superlattice is observed in crystals grown on the (100) surface of a substrate or on a surface slightly tilted from the (100) surface by several degrees. If this spontaneous superlattice is viewed in a cross-section of the (100) surface, the regularity of atom arranging state in the [011] direction (corresponding to <111>A direction) and that in the [0$\bar{1}$1] direction (corresponding to <111>B direction) are different due to the spontaneous superlattice. In other words, when a spontaneous superlattice having a periodic structure in the <111>A direction is formed, a periodic structure corresponding to the period of the spontaneous superlattice appears in the [011] direction on the (100) surface. When a spontaneous superlattice having a periodic structure in the <111>B direction is formed, a periodic structure corresponding to the period of the spontaneous superlattice appears in the [0$\bar{1}$1] direction on the (100) surface. Therefore, since the regularity of atom arranging states varies due to the spontaneous superlattice formed, it is assumed that there is anisotropy, i.e., a difference in characteristics dependent on direction, in physical characteristics of crystals along the [011] and [0$\bar{1}$1] directions which were equivalent to each other before the formation of the spontaneous superlattice.

As an example illustrating this anisotropy, it is illustrated in Physical Review B, Volume 47, Page 4041–4043 (1993). A $Ga_{0.52}In_{0.48}P$ layer grown by MOCVD on a (100) GaAs substrate has a spontaneous superlattice and different optical characteristics (polarization characteristics) dependent on the [110] direction and the [1$\bar{1}$0] direction.

The anisotropy of electrical characteristics of a semiconductor layer including a spontaneous superlattice will be described in detail. FIG. 1 shows growth temperature ($T_{sub}$) dependency of the change in band gap energy ($E_g$) of an AlInAs layer grown on an InP substrate by gas source MBE (molecular beam epitaxy), which was described in Japan Society of Applied Physics, Extended Abstracts, the fifty-fourth Autumn Meeting 1993, Page 200. In the figure, a black dot represents the measured $E_g$ at room temperature and a white dot represents the measured $E_g$ at 77° K. As previously described, the more the spontaneous superlattice is formed, the larger the change in band gap energy becomes. The formation of the spontaneous superlattice is prominent at 450° C. or below. Also described in this reference is that the periodicity of the spontaneous superlattice is in the <111>A direction.

Figure 2:
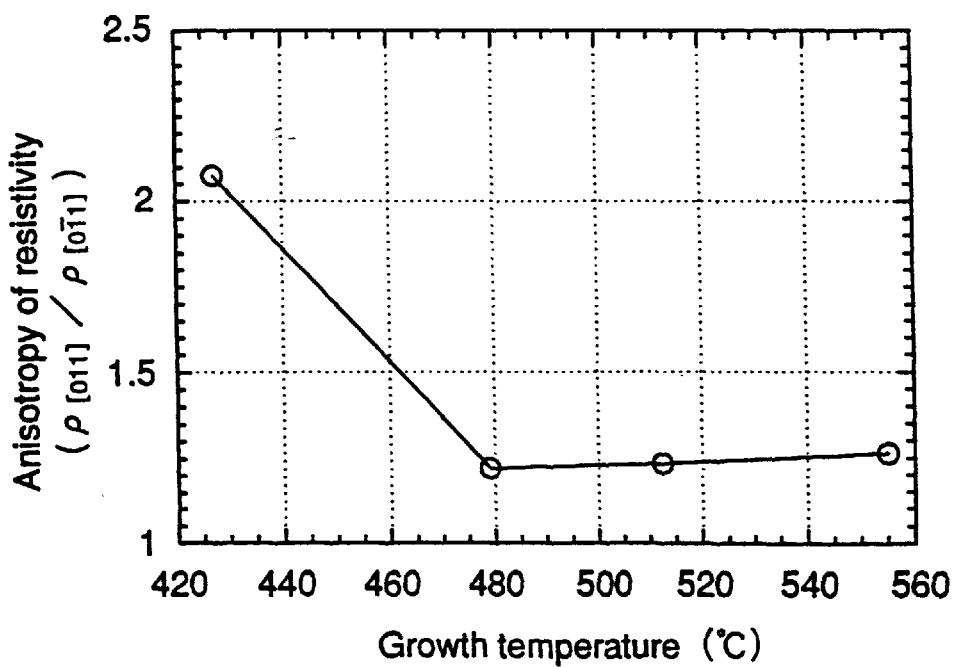
FIG. 2 is a graph illustrating a relationship between the anisotropy in resistivity of an AlInAs layer including a spontaneous superlattice and the growth temperature for describing a structure of a semiconductor device according to a first embodiment of the present invention.

FIG. 2 is a graph showing the experimental results of the study by the inventors of the present invention, on the anisotropy of the resistivity at different growth temperatures for n type AlInAs grown on an InP substrate by gas source MBE. In the figure, the abscissa represents growth temperature and the ordinate represents anisotropy of resistivity, i.e., the ratio $\rho_A/\rho_B$ where $\rho_A$ is the resistance in the [011] direction and $\rho_B$ is the resistance in the [0$\bar{1}$1] direction. In this experiment, n type AlInAs doped with Si in a concentration of $4\times10^{18}$ cm$^{-3}$ is grown to 1000 Å thickness on a substrate comprising InP by gas source MBE at different growth temperatures. Then, the wafer is cleaved to produce stripe-shaped pieces extending in the [0$\bar{1}$1] direction and the [011] direction in such a way that the widths and lengths of the pieces are the same. The resistances between both ends on the surfaces of the stripe-shaped pieces are then measured. In this experiment, since AlInAs is used, the periodicity of the spontaneous superlattice formed by crystal growth is in the <111>A direction.

As illustrated in FIG. 2, in a region below 450° C. in which formation of a spontaneous superlattice is prominent, it can be seen that the anisotropy of the resistivity becomes large, for example, from the ratio of resistances at a growth temperature of 427° C. Furthermore, the resistivity in the [011] direction corresponding to <111>A direction, which is the periodic direction of the spontaneous superlattice, is larger than the resistivity in the [0$\bar{1}$1] direction that corresponds to the <111>B direction. This means that the conduction of electrons in the direction parallel to the periodic direction of the spontaneous superlattice is affected by the periodicity of the spontaneous superlattice, thereby producing an obstacle to the flow of electrons.

Figure 3:
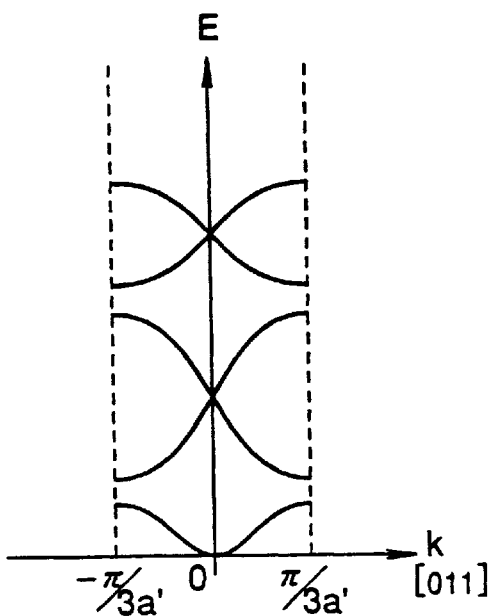
FIGS. 3(a)–3(b) are energy band diagrams for describing the structure of the semiconductor device according to the first embodiment of the present invention.
Figure 3:
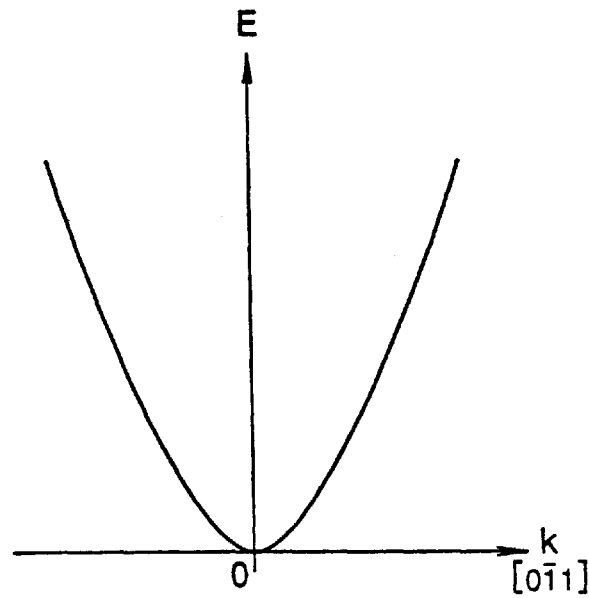

The state of electrons in a semiconductor layer in which a spontaneous superlattice is formed will be described. FIGS. 3(a)–3(b) are energy band diagrams of a semiconductor layer in which a spontaneous superlattice is formed in a <111>A direction. In the figures, the ordinate represents the energy E of an electron and the abscissa represents the momentum k of an electron. FIGS. 3(a)–3(b) show the band diagrams in the [011] and [0$\bar{1}$1] directions, respectively. Furthermore, a' represents a gap between (111) surfaces, i.e., the gap between Group III atom surfaces and the gap between Group V atom surfaces in the semiconductor layer in which this spontaneous superlattice is present.

In a semiconductor layer in which a spontaneous superlattice is formed, a periodic structure having a period that is an integer multiple of the period of the crystal structure is formed in the periodic direction in the (100) surface of the spontaneous superlattice, for example, in the [011] direction in a case of AlInAs. On the other hand, no periodicity of new crystal structure is generated in the [0$\bar{1}$1] direction which is perpendicular to the [011] direction. The energy band diagram of the electrons in the conduction band which conduct in the [011] direction having the newly formed periodicity includes multiple mini-bands formed by the folding of a band due to the new periodicity (zone-folding), as described in Material Research Society (MRS), Volume 220, Page 311 (1991) for a Ge/Si spontaneous superlattice. Therefore, in the semiconductor layer in which the spontaneous superlattice is formed in the <111>A direction, the band diagram in the [011] direction is as shown in FIG. 3(a). On the other hand, even when the spontaneous superlattice is formed, the band diagram of the electrons flowing in the [0$\bar{1}$1] direction does not differ from the regular band diagram obtained when no spontaneous superlattice is formed (FIG. 3(b)). Therefore, depending on which direction the electrons are flowing, that is, depending on whether the electrons are influenced by the periodic potential due to the spontaneous superlattice, the effective mass of the electron changes, resulting in an anisotropy in conductivity.

Figure 4:
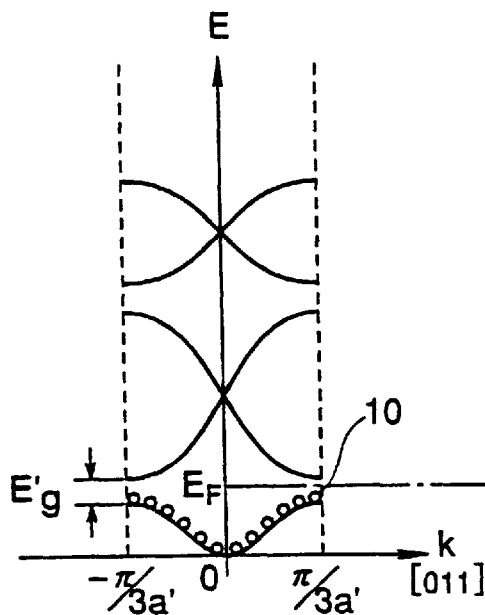
FIGS. 4(a)–4(b) are energy band diagrams for describing the structure of the semiconductor device according to the first embodiment of the present invention.
Figure 4:
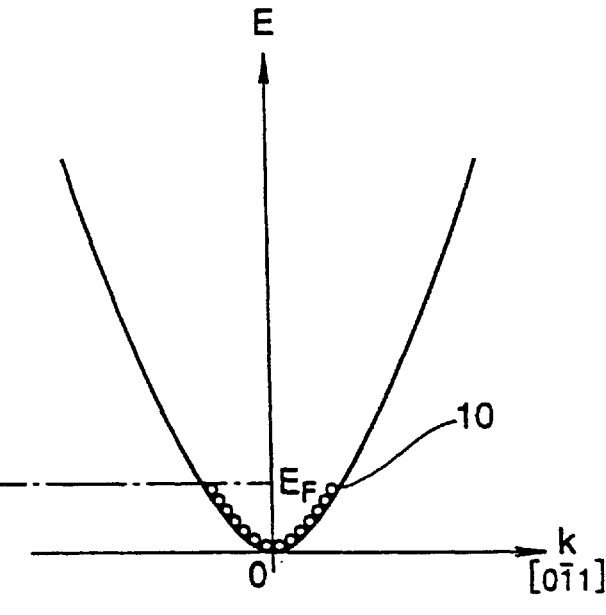

Mini-bands are formed in the [011] direction and the band gap energy $E'_g$ is generated between the mini-bands. When the Fermi level corresponds to the band gap energy $E'_g$, the electrons 10 fill the lowest energy band as shown in FIG. 4(a), and even if an electric field is applied in the [011] direction, the electrons cannot conduct in the [011] direction but can conduct freely only in the [0$\bar{1}$1] direction (FIG. 4(b)). Therefore, the anisotropy of resistivity then becomes a maximum, and it is possible to increase the anisotropy of the resistivity by a factor of several hundreds. In FIGS. 4(a)–4(b), the same letters used in FIGS. 3(a)–3(b) represent the same or corresponding parts. Reference numeral 10 designates an electron.

Figure 8:
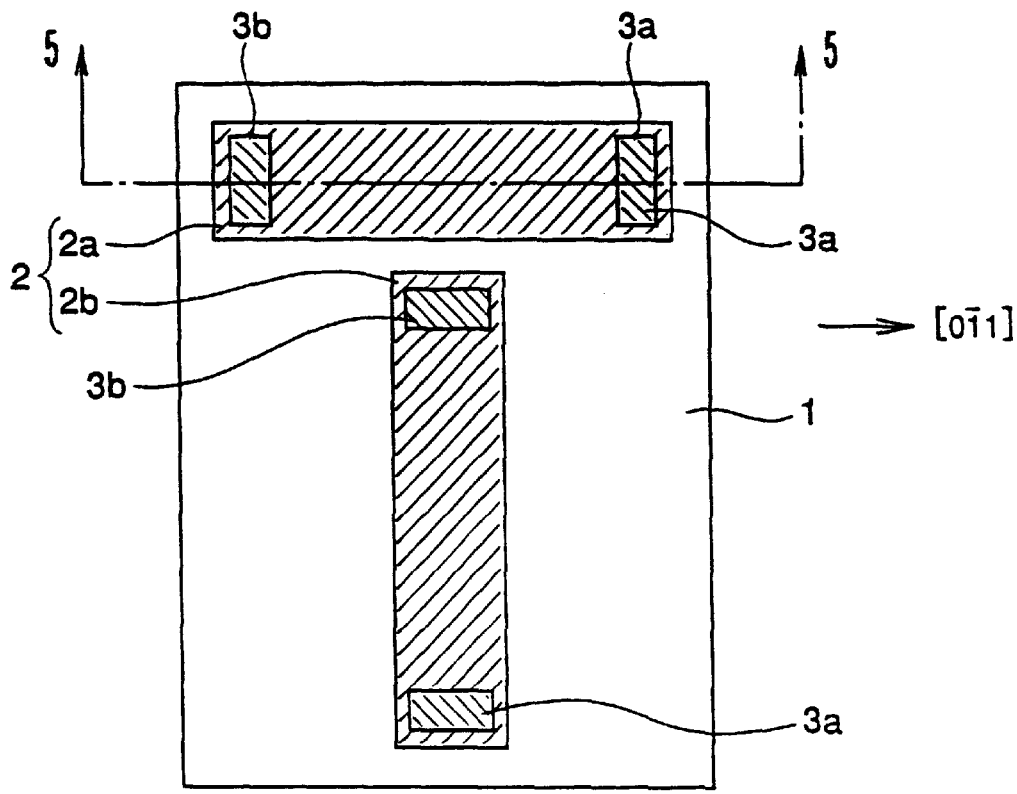
FIG. 8 is a plan view illustrating the structure of the semiconductor device according to the first embodiment of the present invention.

FIG. 8 is a plan view illustrating a structure of a semiconductor device according to a first embodiment of the present invention. In the figure, reference numeral 1 designates a semi-insulating InP substrate, and reference numeral 2 designates AlInAs layers having a stripe shape with a prescribed width disposed on the (100) surface of the semi-insulating InP substrate 1. The AlInAs layer 2 has a thickness of about 1000 Å and includes a spontaneous superlattice. Furthermore, this AlInAs layer 2 is doped with impurities such as Si to a concentration of about $4\times10^{18}$ cm$^{-3}$ so that the Fermi level is between the mini-bands in the periodic direction of the spontaneous superlattice.

Reference numeral 2a designates the AlInAs layer 2 having the [0$\bar{1}$1] stripe direction and reference numeral 2b designates the AlInAs layer 2 having the [011] stripe direction. Reference numerals 3a and 3b designate metal electrodes (terminals) comprising Au (gold) or the like disposed on opposite ends along the stripe direction of the AlInAs layer 2. In the semiconductor device of this embodiment, the stripe-shaped AlInAs layer 2 in which the spontaneous superlattice is present includes the electrodes 3a and 3b so that the AlInAs layer 2 is used as a resistor element. The electrodes 3a and 3b are connected to other circuit elements (not shown in the figure) on the same semi-insulating InP substrate 1 or to circuit elements (not shown in the figure) on a different substrate.

Figure 5:
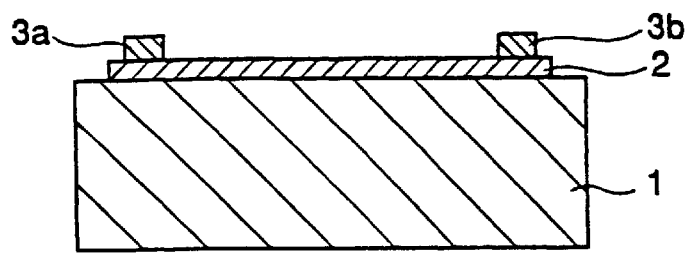
FIG. 5 is a cross-sectional view illustrating the structure of the semiconductor device according to the first embodiment of the present invention.
Figure 6:
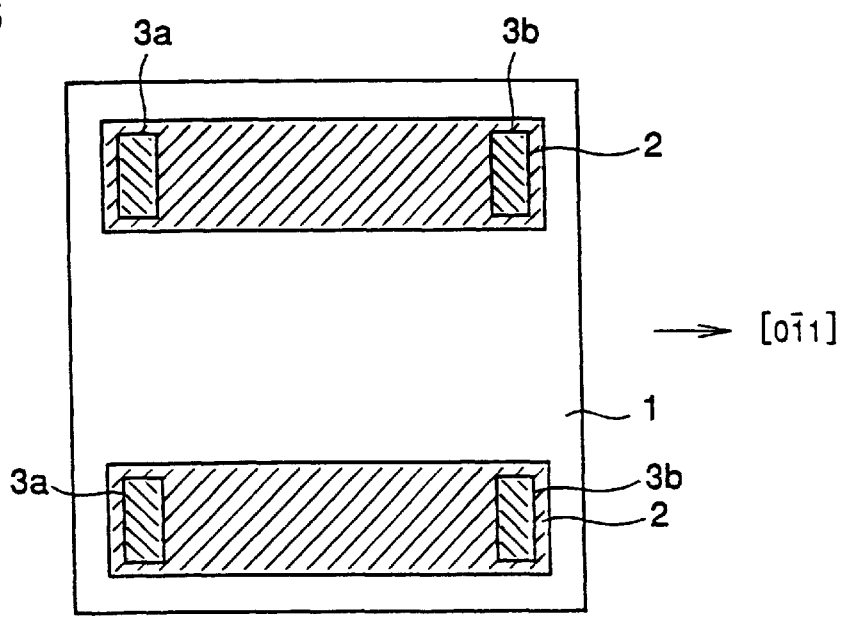
FIG. 6 is a plan view for describing the structure of the semiconductor device according to the first embodiment of the present invention.
Figure 7:
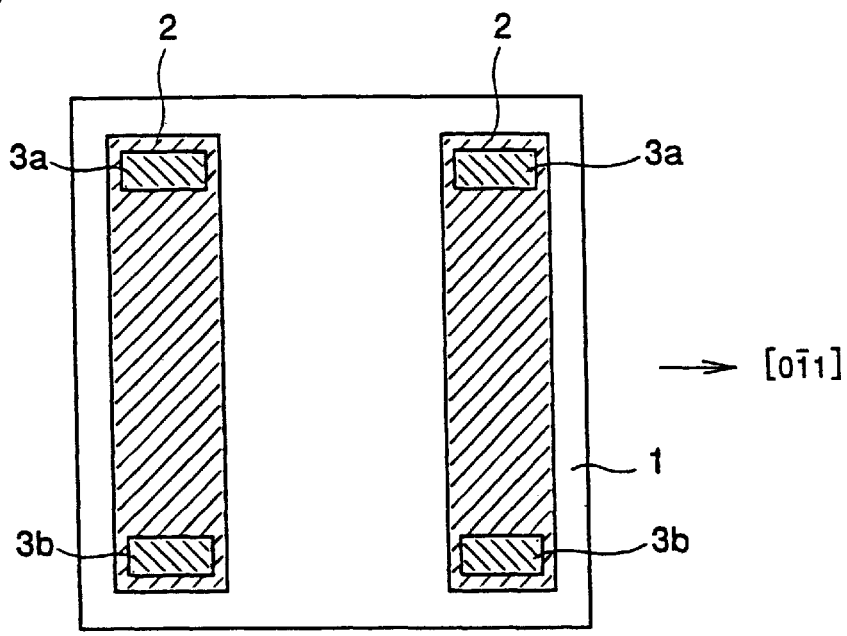
FIG. 7 is a plan view for describing the structure of the semiconductor device according to the first embodiment of the present invention.

FIG. 5 is a cross-sectional view illustrating the semiconductor device shown in FIG. 8 taken along a line 5—5. FIGS. 6 and 7 are plan views for explaining the structure of the semiconductor device according to the first embodiment. In these figures, the same reference numerals used in FIG. 8 designate the same or corresponding parts.

The fabricating method will be described. First, the AlInAs layer doped with Si in a concentration of about $4\times10^{18}$ cm$^{-3}$ is formed by crystal growth at a temperature of about 450° C. or below so that a spontaneous superlattice is formed on the (100) surface of the semi-insulating InP substrate 1 by gas source MBE. Next, using a resist, etching is performed using a solution such as hydrofluoric acid so that the stripe-shaped AlInAs layers 2a and 2b are left. Then, the metal electrodes 3a and 3b are formed, preferably by evaporation, thereby producing the semiconductor device as shown in FIG. 5.

In the semiconductor device of this embodiment, since the AlInAs layer 2 doped with Si includes the spontaneous superlattice in the <111>A direction, the resistivity in the (100) surface is anisotropic as described previously. Therefore, when, for example, the stripe direction of the AlInAs layer 2 is arranged along the [0$\bar{1}$1] direction, i.e., the direction perpendicular to the periodic direction of the spontaneous superlattice, and the electrodes 3a and 3b are disposed along the [0$\bar{1}$1] direction to use the AlInAs layer 2 as a resistor element, as shown in FIG. 6, the resistivity becomes low. Alternatively, when the stripe direction of the AlInAs layer 2 is the [011] direction, i.e., the periodic direction of the spontaneous superlattice, and the electrodes 3a and 3b are arranged along the [011] direction, as shown in FIG. 7, the resistivity becomes high. When the stripe direction is the [011] direction, the resistivity is increased to several hundreds of times the resistivity when the stripe direction is along the [0$\bar{1}$1] direction as described above. It is therefore possible to vary the resistivity of the AlInAs layer 2 by changing the stripe direction of the AlInAs layer serving as a resistor element relative to the periodic direction of the spontaneous superlattice. This makes it possible to form resistor elements having resistances which differ considerably.

Therefore, by simultaneously forming the AlInAs layers 2a and 2b having stripe directions in [0$\bar{1}$1] and [011] directions, respectively, on the substrate 1 by etching as shown in FIG. 8, it is possible to integrate resistor elements of considerably different resistances on a single substrate in a single process and to easily form resistor elements of considerably different resistances within a limited area of a chip.

As described above, according to this embodiment, the AlInAs layer 2 having the spontaneous superlattice including impurities is used as the resistor element. Therefore, the AlInAs layer 2 is anisotropic in the (100) surface and, by changing the direction in which the stripe-shaped AlInAs layer 2 is arranged, the resistivity of the resistor element can be changed considerably. A semiconductor device such as an integrated circuit including multiple resistor elements of considerably different resistances can also be provided within a single chip.

Figure 9:
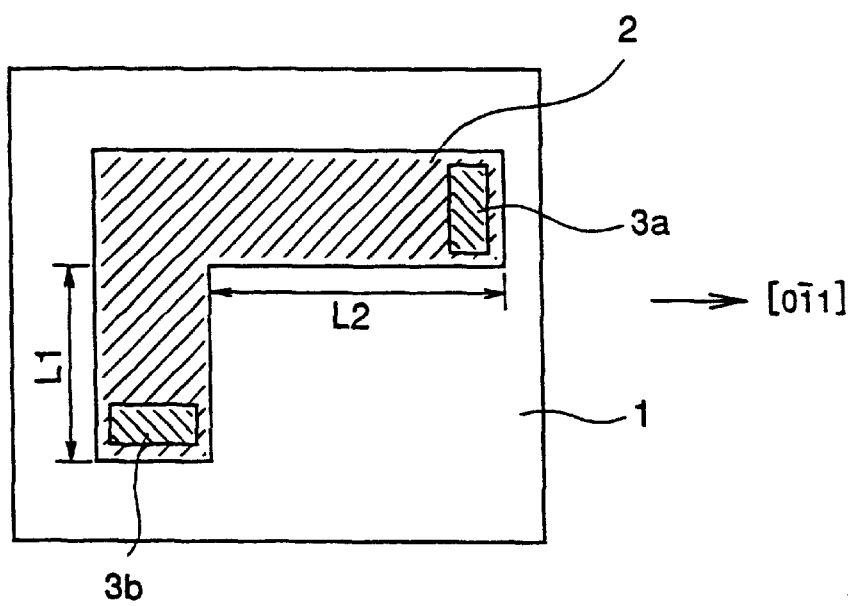
FIG. 9 is a plan view illustrating a modified version of the semiconductor device according to the first embodiment of the present invention.

While in the first embodiment the AlInAs layer 2 serving as a resistor element in a stripe shape is described, this invention can be applied to cases in which the AlInAs layer 2 has other shapes, such as an S-shape. For example, the AlInAs layer 2 can be of L-shape, extending in the [0$\bar{1}$1] direction and bending into the [011] direction as shown in FIG. 9. In this case, a similar effect as in the first embodiment is obtained, and by choosing appropriate values for $L_1$ and $L_2$ in the [011] and [0$\bar{1}$1] directions, respectively, a resistor element having an arbitrary resistance ranging from an extremely small resistance to a very large resistance can be provided. In FIG. 9, the same reference numerals used in FIG. 8 designate the same or corresponding parts.

While in the first embodiment the stripe direction of the AlInAs layer 2 serving as the resistor element is either the [0$\bar{1}$1] direction or [011] direction, the present invention can be applied to cases in which the stripe direction of the AlInAs layer 2 is a direction between the [0$\bar{1}$1] and [011] directions, and a similar effect as in the first embodiment can be obtained. The resistor element having an arbitrary resistance ranging from a small to a large resistance depending on the angle from the [0$\bar{1}$1] (or [011]) direction can be provided.

Figure 10:
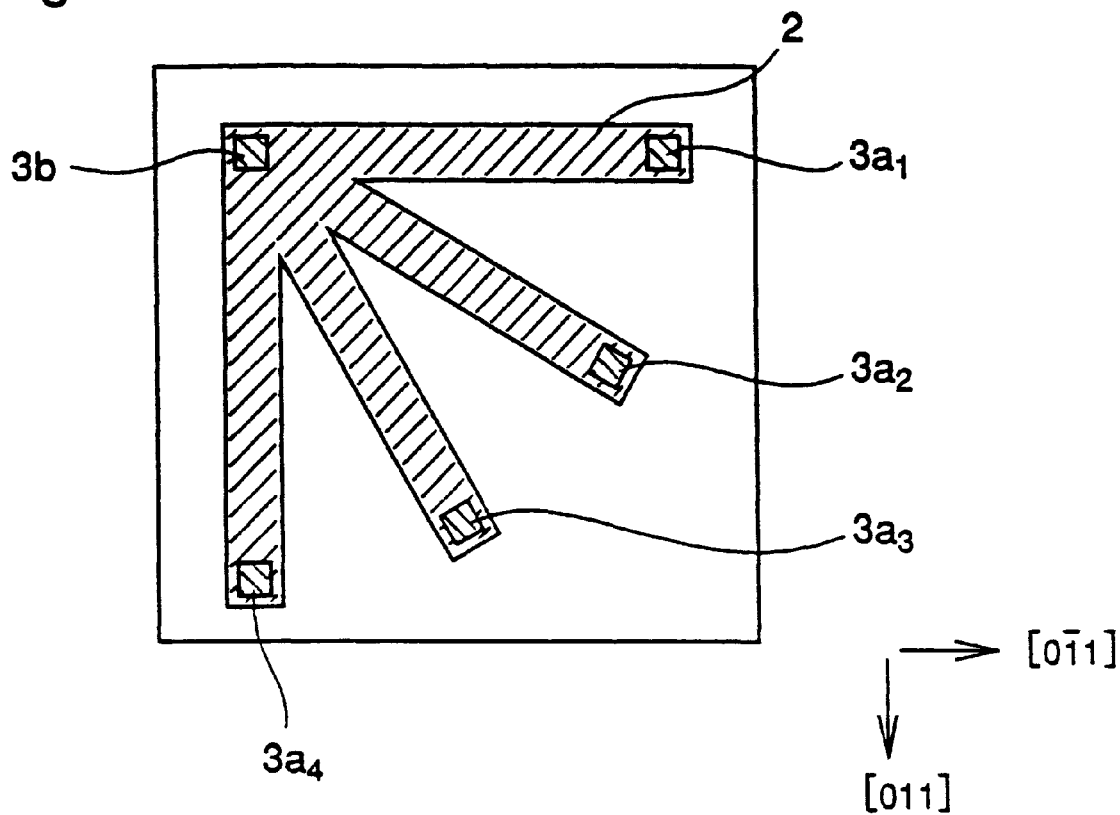
FIG. 10 is a plan view illustrating another modified version of the semiconductor device according to the first embodiment of the present invention.

For example, as shown in FIG. 10, when the AlInAs layer 2 comprises four stripe-shaped members of equal lengths converging to a prescribed point on the semiconductor substrate 1, two of which are in the [0$\bar{1}$1] and [011] directions and the remaining two of which are in the directions between [0$\bar{1}$1] and [011] directions, the electrode 3b is placed at the point to which the four stripe-shaped members converge. The electrodes $3a_1$, $3a_2$, $3a_3$, and $3a_4$ are disposed in this order on respective ends of the stripe-shaped members from the [0$\bar{1}$1] to the [011] direction, respectively, so four different resistances can respectively be obtained by connecting the electrode 3b and an electrode selected from $3a_1$, $3a_2$, $3a_3$, and $3a_4$. If resistances obtained by choosing the electrodes 3b and $3a_1$ and by choosing the electrodes 3b and $3a_2$ are represented as $R_1$ and $R_2$, respectively, and resistances obtained by choosing the electrode 3b and $3a_3$ and by choosing the electrode 3b and $3a_4$ are represented as $R_3$ and $R_4$, respectively, the resistance values become $R_1$, $R_2$, $R_3$, and $R_4$ in the order of increasing resistance, and it is apparent that the resistance value and the resistivity become a maximum when the stripe direction is the [011] direction relative to the cases in which the stripe direction is the [0$\bar{1}$1] direction.

Embodiment 2

Figure 11:
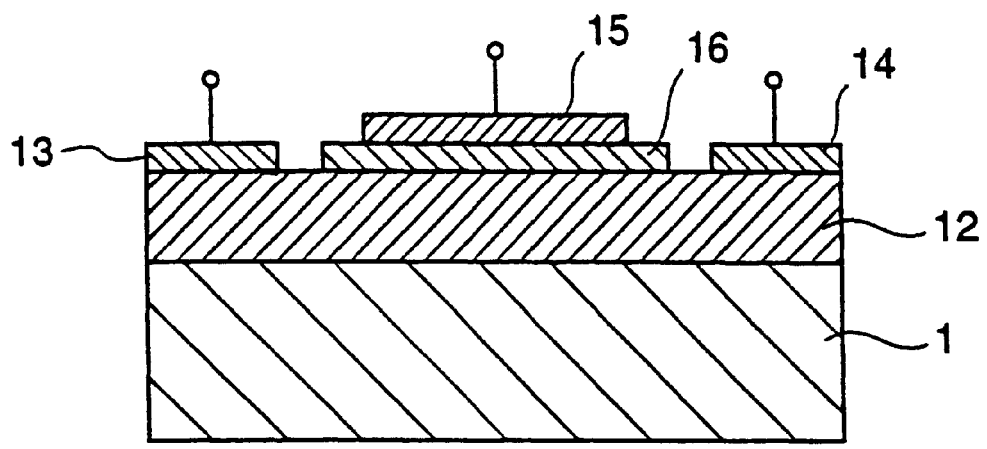
FIG. 11 is a cross-sectional view illustrating a structure of a semiconductor device according to a second embodiment of the present invention.

FIG. 11 is a cross-sectional view illustrating a structure of a semiconductor device according to a second embodiment of the present invention. The semiconductor device of this second embodiment includes the AlInAs layer described in the first embodiment in which the spontaneous superlattice is formed. In the figure, the same reference numerals used in FIG. 8 designate the same or corresponding parts. Reference numeral 12 designates the AlInAs layer in which the spontaneous superlattice is formed and which is doped with impurities such as Si so that the Fermi level of the AlInAs layer 12 is located within the mini-band that is formed in the periodic direction of the spontaneous superlattice. Reference numeral 13 designates a source electrode, reference numeral 14 designates a drain electrode, reference numeral 15 designates a gate electrode, and reference numeral 16 designates an insulating film comprising a material such as SiN and SiO$_2$. In this embodiment, the source electrode 13, the gate electrode 15, and the drain electrode 14 are arranged in the [011] direction.

Figure 12:
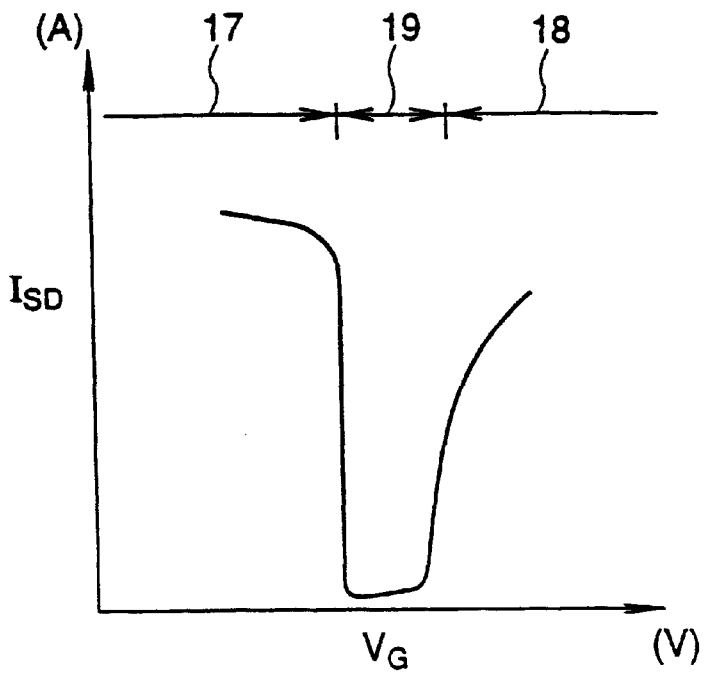
FIG. 12 is a graph for describing operational characteristics of the semiconductor device according to the second embodiment of the present invention.

FIG. 12 is a graph illustrating the relationship between the gate voltage $V_G$ and the source-drain current $I_{SD}$ for explaining the operation of the semiconductor device of the second embodiment. In the figure, reference numeral 19 represents a state where the semiconductor device is turned off and reference numerals 17 and 18 represent states where the semiconductor device is turned on.

Figure 13:
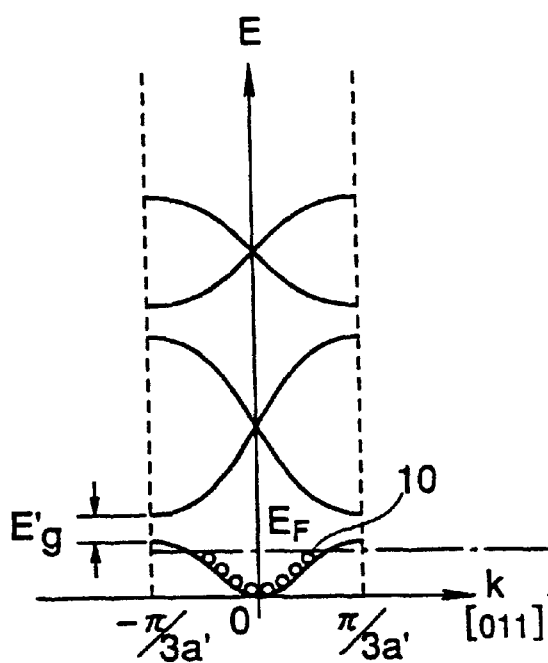
FIGS. 13(a)–13(b) are energy band diagrams for describing the structure of the semiconductor device according to the second embodiment of the present invention.
Figure 13:
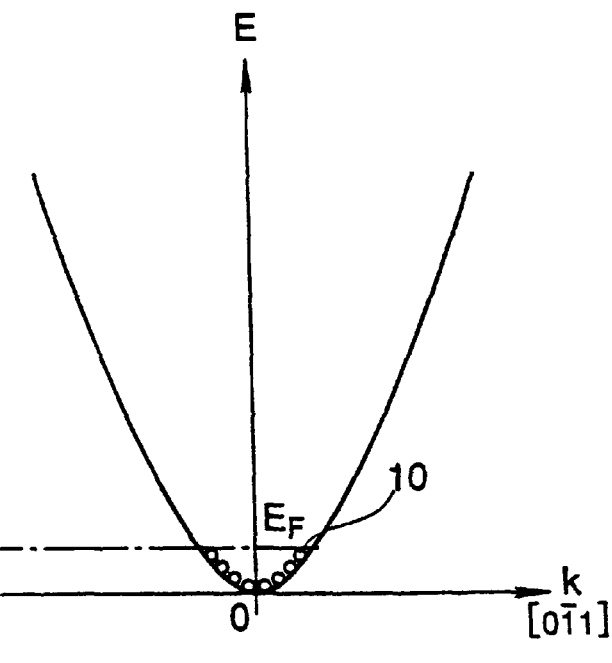
Figure 14:
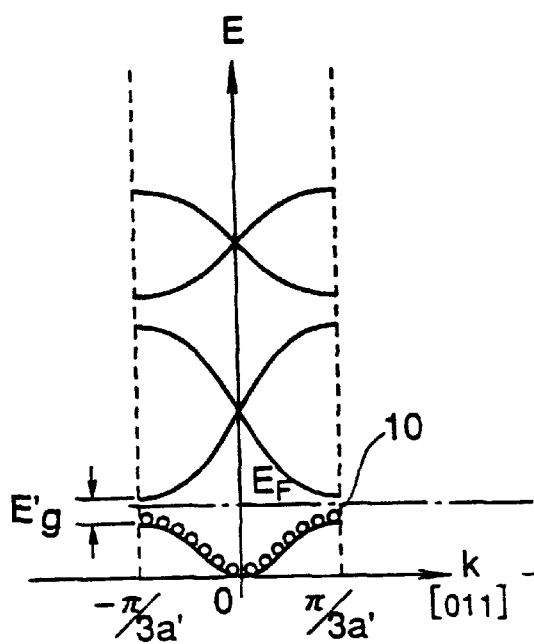
FIGS. 14(a)–14(b) are energy band diagrams for describing the structure of the semiconductor device according to the second embodiment of the present invention.
Figure 14:
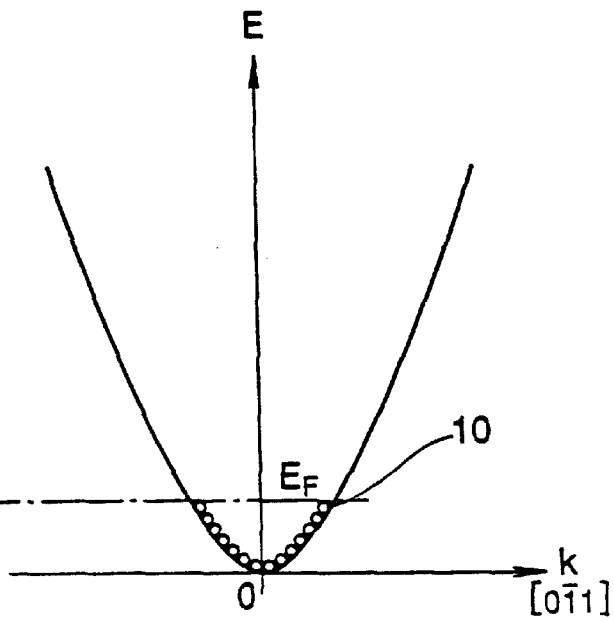
Figure 15:
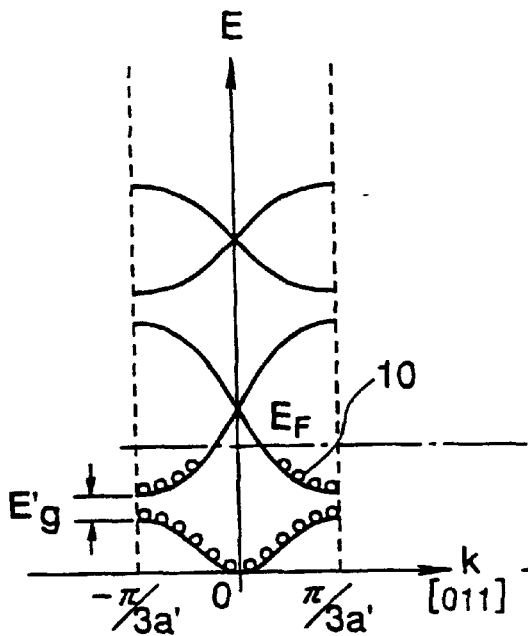
FIGS. 15(a)–15(b) are energy band diagrams for describing the structure of the semiconductor device according to the second embodiment of the present invention.
Figure 15:
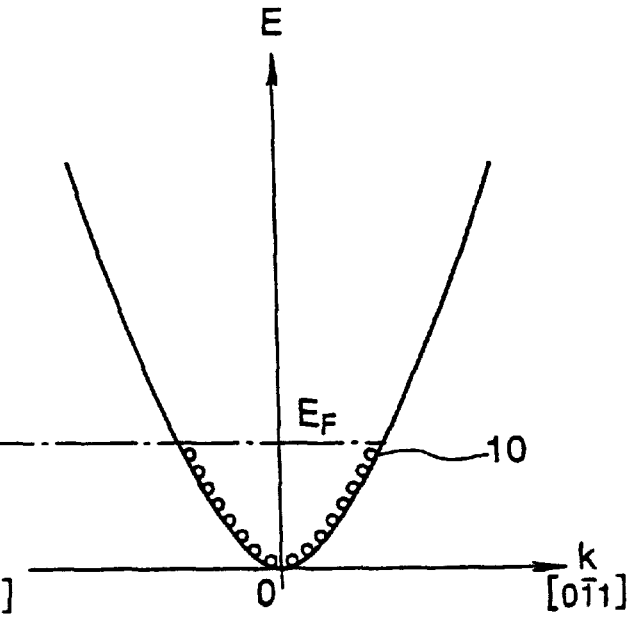

FIGS. 13(a)–13(b), 14(a)–14(b), and 15(a)–15(b) show the band diagrams of the AlInAs layer in which the spontaneous superlattice is formed for explaining the operation of the semiconductor device of the second embodiment. In the figures, the ordinate represents electron energy E, the abscissa represents momentum k, and a' represents a gap between the (111) surfaces of the AlInAs layer including the spontaneous superlattice, i.e., a gap between the Group III surfaces or the Group V surfaces. FIGS. 13(a), 14(a), and 15(a) show the band diagrams in the [011] direction and FIGS. 13(b), 14(b), and 15(b) show the band diagrams in the [0$\bar{1}$1] direction.

The fabricating method will be described. First, the AlInAs layer 12 doped with Si is grown on the (100) surface of the semi-insulating InP substrate 1 by gas source MBE at about 450° C. or below so that the spontaneous superlattice is formed. Next, the insulating film 16 is formed on the AlInAs layer 12, and the portions of the insulating film 16 where the source electrode 13 and the drain electrode 14 are to be formed are removed by etching. Then, the source electrode 13 and the drain electrode 14 are formed on the AlInAs layer 12, and the gate electrode 15 is formed on the insulating film 16 between the source electrode 13 and the drain electrode 14, thereby completing the semiconductor device shown in FIG. 11.

Operation of the device will be described with reference to FIGS. 11 and 12. The semiconductor device of the second embodiment controls the current flowing between the source electrode 13 and the drain electrode 14 in response to application of a bias voltage ($V_G$) to the gate electrode 15. First, if the bias voltage $V_G$ is applied to the gate electrode 15 when a current is flowing between the source electrode 13 and the drain electrode 14, i.e., in the on-state 17, the Fermi level in the AlInAs layer 2 changes. As the bias voltage is changed, since the source electrode 13 and the drain electrode 14 are arranged in the [011] direction, which is the periodic direction of the spontaneous superlattice in the AlInAs layer 12, the source-drain current $I_{SD}$ stops flowing at a prescribed voltage, entering the off-state 19 as illustrated in FIG. 12. If the voltage is further increased, it again enters the on-state 18 in which $I_{SD}$ flows. Therefore, in this second embodiment, a semiconductor device which is operated as a switching device having a characteristic that the source-drain current can successively be turned on, off, and on by increasing the gate voltage is obtained.

The details of the operation of the semiconductor device will be described with reference to the band diagrams illustrated in FIGS. 13(a)–13(b), 14(a)–14(b), and 15(a)15(b). Since the periodic direction of the spontaneous superlattice of the AlInAs layer 12 including the spontaneous superlattice in this embodiment is the <111>B direction, the band diagrams have the same structure as the band diagrams in FIGS. 4(a) and 4(b).

First, when the Fermi level is in the lowest mini-band as shown in FIG. 13(a), the semiconductor device is in the on-state as shown in FIG. 12 and the electrons can flow in the [011] direction. Next, if the Fermi level is brought inside the energy band gap E'$_g$ by applying a bias voltage to the gate electrode 15, the electrons can no longer flow in the [011] direction (FIG. 14(a)) and, therefore, the off-state 19 results. If the bias voltage is further increased so that the electrons exist in the mini-band that is one step higher in energy than the lowest state, the source-drain current again starts to flow and the on-state 18 (FIG. 15 (a)) is entered. Since the Fermi level in the AlInAs layer 2 is changed and controlled by the gate voltage and switching on and off of the current depends on whether the Fermi level is in the mini-band, quicker switching than in a semiconductor device, such as a prior art field effect transistor, in which current flow is controlled by changing a depletion layer with a gate voltage, is possible.

As described above, in this embodiment, the source electrode 13 and the drain electrode 14 are disposed on the AlInAs layer 12 including the spontaneous superlattice, and the gate electrode 15 is disposed on the AlInAs layer 12 between the source electrode 13 and the drain electrode 14 with the insulating film 16 between the AlInAs layer 12 and the gate electrode 15. Therefore, quick switching operation is possible, and a semiconductor device that can switch on, off, and on with an increase (or decrease) in the gate voltage can be obtained.

While in this second embodiment the dopant impurities place the Fermi level in the lowest mini-band when no gate voltage is applied, the Fermi level can be chosen so that it is between the mini-bands. In that case, the semiconductor device can be switched from the off-state to the on-state by applying either a plus or minus gate voltage.

Embodiment 3

FIG. 16(a) is a cross-sectional view in the [0$\bar{1}$1] surface illustrating the structure of the main portion of a semiconductor device according to a third embodiment of the present invention, and FIG. 16(b) is the energy band diagram in the crystal growth direction of the semiconductor device. In the figures, reference numeral 21 designates a semi-insulating GaAs substrate, reference numeral 22 designates an AlGaInP layer disposed on the (100) surface of the GaAs substrate 21, and reference numeral 23 designates an InGaP layer having a thickness of several hundreds of Angstroms or less, including the spontaneous superlattice and doped with impurities such as Si. Reference numeral 24 designates an AlGaInP layer and reference numeral 10 designates electrons. The energy band diagram of FIG. 16(b) illustrates the bottom of the conduction band and the abscissa represents the electron energy E.

The main portion of the semiconductor device of the third embodiment is formed as follows. First, the AlGaInP layer 22 is formed on the (100) surface of the semi-insulating GaAs substrate 21 preferably by gas source MBE. Then, the InGaP layer 23 doped with impurities, such as Si, is grown at about 450° C. or below so that a spontaneous superlattice is formed, and the AlGaInP layer 24 is sequentially grown. Dopant impurities such as Si and the like are added to the InGaP layer 23 so that the Fermi level is in the energy gap between the mini-bands in the band diagram of the [0$\bar{1}$1] direction, which is the arranging direction of the spontaneous superlattice.

The operation of the semiconductor device of the third embodiment will be described. In the double heterojunction structure in which the GaInP layer 23 is sandwiched with the AlGaInP layer 24 and another AlGaInP layer 22 which is lattice matched with the GaAs substrate 21 as shown in FIG. 16(a), the band gap energy becomes as illustrated in FIG. 16(b). The band gap energy of the AlGaInP is larger than that of the GaInP, and a quantum well is formed in the GaInP layer 23, confining electrons in the well. Therefore, the electrons 10 exist in a two-dimensional state in the (100) surface in the well of the double heterojunction structure.

It is generally known that a spontaneous superlattice of InGaP is formed mainly in a <111>B direction. Therefore, as described for the first embodiment with reference to FIGS. 4(a)–4(b), if the Fermi level is in the band gap energy between the mini-bands in the [0$\bar{1}$1] direction, there is an anisotropy in the (100) surface of the InGaP layer including the spontaneous superlattice, and the electrons cannot flow in the [0$\bar{1}$1] direction, the periodic direction of the spontaneous superlattice. The electrons can only flow in the [011] direction. Therefore, since the electrons are confined within the (100) surface by the heterojunction as described above, the electrons are in a one-dimensional state in which they can only flow in the [011] direction. By doping the InGaP layer 23 with impurities so that the Fermi level is between mini-bands in the [0$\bar{1}$1] direction, the one-dimensional electron state, which is effective in improving semiconductor laser characteristics and in realizing high speed operation of electronic devices, can be realized because of the two-dimensional confinement by the quantum well structure and the restriction on the direction in which the electrons can flow due to the periodicity of the spontaneous superlattice.

Since in this embodiment the GaInP layer 23 including the spontaneous superlattice is sandwiched by the AlGaInP layers 22 and 24, the one-dimensional electron state can be obtained without employing the complicated step flow growth method described in the prior art. Additionally, an expensive growth apparatus of high precision that is necessary for the step flow growth is not required and a semiconductor device superior in characteristics can easily be provided.

Embodiment 4

FIG. 17 is a cross-sectional view illustrating a structure of a semiconductor device according to a fourth embodiment of the present invention. In the figure, the same reference numerals used in FIGS. 16(a)–16(b) designate the same or corresponding parts. Reference numeral 25 designates an undoped AlGaInP layer, reference numerals 26, 28, and 27 designate a source electrode, a gate electrode, and a drain electrode, respectively, arranged in the [011] direction. The semiconductor device of the fourth embodiment includes the structure of the main portion of the semiconductor device described as the third embodiment, the gate electrode 28 for controlling the Fermi level of the InGaP layer 23 is located between the source and drain electrodes, and the GaInP layer 23 including the spontaneous superlattice is used as a one-dimensional electron channel layer. The semiconductor device of the fourth embodiment is fabricated by the method of fabricating the third embodiment with additional steps as follows. After forming the InGaP layer 23 including the spontaneous superlattice, the undoped AlGaInP layer 25 is formed on the surface of the InGaP layer 23. The undoped AlGaInP layer 25 is selectively etched until the InGaP layer 23 is reached to create openings for forming the source electrode 26 and the drain electrode 27. The source electrode 26 and the drain electrode 27 are disposed in the openings so that they make ohmic contacts with the layers and the gate electrode 28 is disposed on the undoped AlGaInP layer 25 at a position between the source electrode 26 and the drain electrode 27.

The operation will be described. When no gate voltage is applied to the gate electrode 28, since the InGaP layer 23 including the spontaneous superlattice is sandwiched by the AlGaInP layer 22 and the undoped AlGaInP layer 25, the electrons in the InGaP layer 23 are, as described for the third embodiment, in the one-dimensional conduction state in the [011] direction and flow between the source and the drain at a high speed. Therefore, a semiconductor device which can operate at high-speed can be obtained.

Next, when a gate voltage is applied to the gate electrode 28, as described in the second embodiment, the Fermi level of the InGaP layer 23 changes and shifts to the mini-band along the arranging direction of the spontaneous superlattice of the InGaP layer 23, and the electrons can flow in the arranging direction of the spontaneous superlattice. This change destroys the one dimensionality of the InGaP layer 23 and reduces the electron speed. Therefore, an operation which resembles a switching operation is possible. Thus, a high performance semiconductor device which can operate with high speed can be provided easily in this fourth embodiment as in the third embodiment.

In the fourth embodiment, the undoped AlGaInP layer 25 is selectively removed by etching until the InGaP layer 23 is reached, and the source electrode 26 and the drain electrode 27 are disposed on and in ohmic contact with the InGaP layer 23. However, since in this invention it is only required that the source electrode 26 and the drain electrode 27 make ohmic contacts with the InGaP layer 23, the portions of the undoped AlGaInP layer 25 where the source electrode 26 and the drain electrode 27 are to be disposed may be doped with a high concentration of impurities to a depth reaching the InGaP layer 23. The source electrode 26 and the drain electrode 27 may be disposed on and in ohmic contact with these doped regions in place of removing portions of the undoped AlGaInP layer 25. Even in this case, a similar effect is obtained.

Embodiment 5

Figure 18:
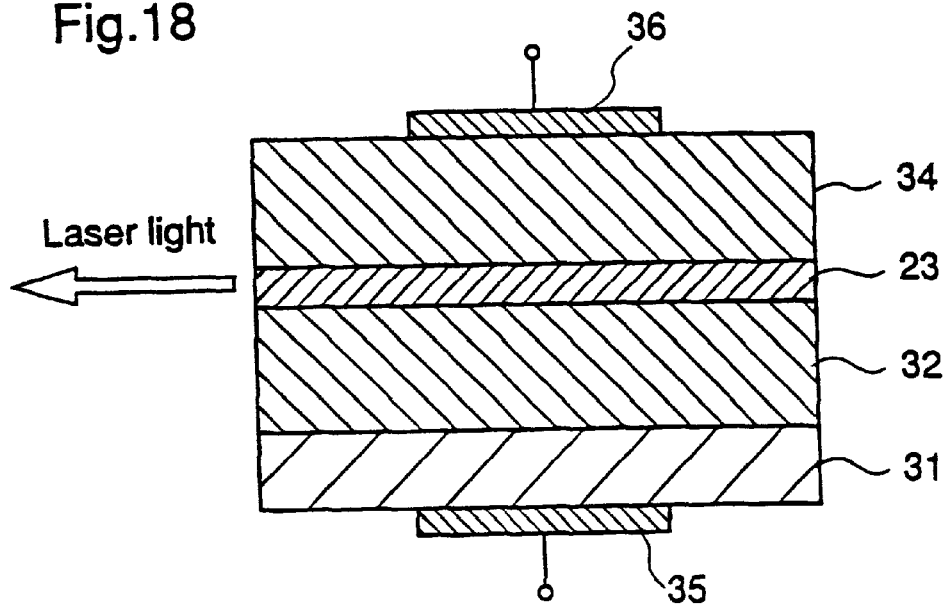
FIG. 18 is a cross-sectional view illustrating a structure of a semiconductor device according to a fifth embodiment of the present invention.
Figure 19:
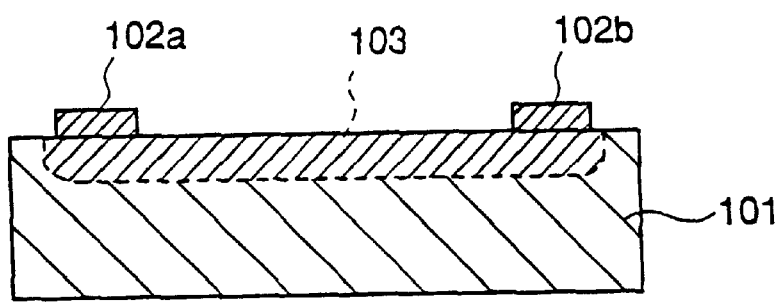
FIG. 19 is a cross-sectional view illustrating a structure of a resistor element of a prior art semiconductor device.
Figure 20:
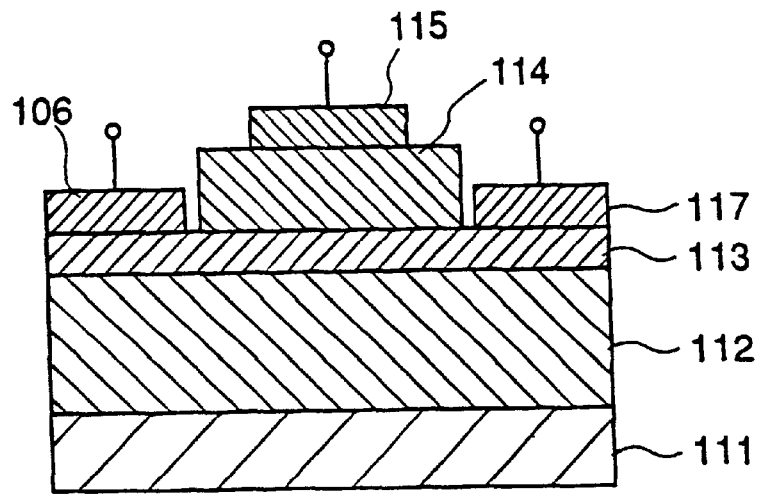
FIG. 20 is a cross-sectional view illustrating a structure of a high electron mobility transistor as an example of a prior art semiconductor device.
Figure 21:
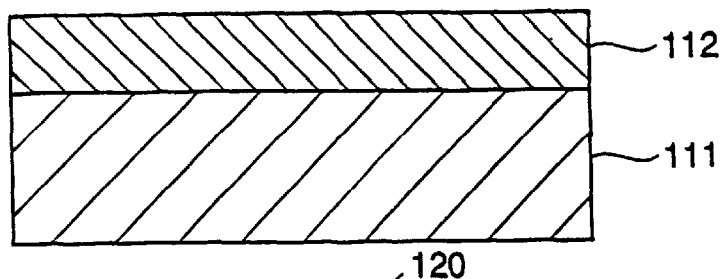
FIGS. 21(a)–21(e) are cross-sectional process views illustrating a method of fabricating a prior art high electron mobility transistor.
Figure 21:
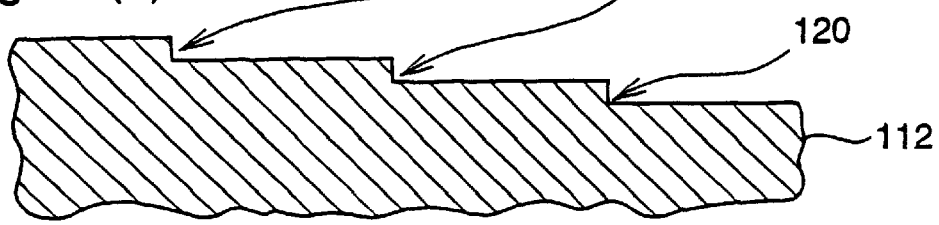
Figure 21:
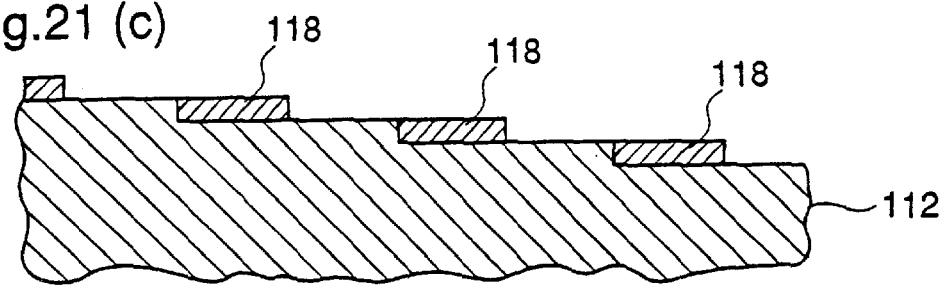
Figure 21:
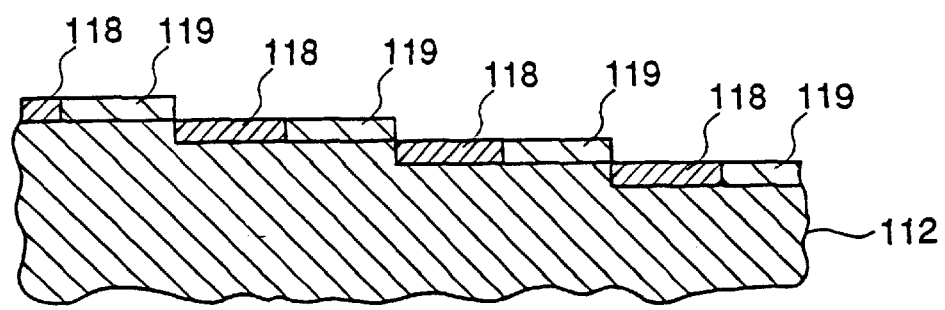
Figure 21:
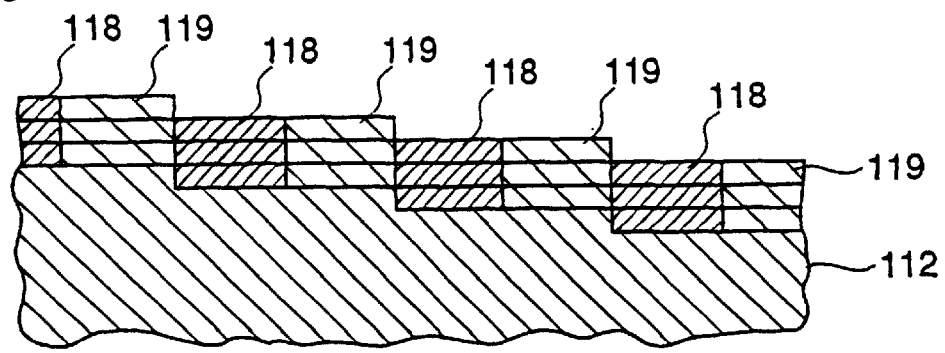

FIG. 18 is a cross-sectional view illustrating a structure of a semiconductor device according to a modified version of a fifth embodiment of the present invention. The semiconductor device of the fifth embodiment is a double heterojunction type semiconductor laser that includes the InGaP layer 23 having the one-dimensional electron state as an active layer, as shown in the third embodiment. In the figure, the same reference numerals used in FIG. 16 designate the same or corresponding parts. Reference numeral 31 designates an n type GaAs substrate, reference numeral 32 designates an n type AlGaInP cladding layer, reference numeral 34 designates a p type AlGaInP cladding layer, and reference numerals 35 and 36 designate an n side electrode and a p side electrode, respectively.

The semiconductor laser of the fifth embodiment, as in the semiconductor device illustrated in FIGS. 16(a)–16(b), is fabricated as follows. The n type AlGaInP cladding layer 32, the InGaP layer 23 including the spontaneous superlattice, and the p type AlGaInP cladding layer 34 are formed on the n type GaAs substrate 31 by gas source MBE. Then, the n side electrode 35 is formed on the rear surface of the n type GaAs substrate 31 and the p side electrode 36 is formed on the surface of the p type AlGaInP cladding layer 34, both preferably by evaporation.

As described in, for example, Applied Physics Letters, Volume 62, Number 7, Page 729, it is generally known that a semiconductor laser can be significantly improved in its laser characteristics by the one-dimensional conduction state in the active layer. In this embodiment, since the InGaP layer 23 including the spontaneous superlattice in which the one-dimensional conduction state can easily be achieved is used as the active layer, improvements such as the realization of a low threshold current of a semiconductor laser can easily be made.

While in the third, fourth, and fifth embodiments a structure in which the InGaP layer is sandwiched by AlGaInP layers is utilized in order to confine electrons two-dimensionally in the InGaP layer including the spontaneous superlattice, the InGaP layer may be sandwiched by layers comprising other materials having band gap energies larger than the band gap energy of the InGaP layer. Even in this case, similar effects are obtained.

While in the third, fourth, and fifth embodiments the InGaP layer including the spontaneous superlattice is sandwiched by heterojunctions, the InGaP layer may be sandwiched by homojunctions. For example, if the layers sandwiching the InGaP layer including the spontaneous superlattice are other InGaP layers that are grown under such conditions that a spontaneous superlattice is not formed, then, since the layer not including the spontaneous superlattice has a larger band gap energy than the layer including the spontaneous superlattice, the electrons can be two-dimensionally confined in the layer including the spontaneous superlattice, thereby obtaining similar effects.

While in the third, fourth, and fifth embodiments the InGaP layer including the spontaneous superlattice is used in order to obtain the one-dimensional conduction state for electrons, since holes are subjected to the same restriction on the flow direction by the spontaneous superlattice as are the electrons, the InGaP layer including the spontaneous superlattice can be formed at a prescribed location of the semiconductor device in order to restrict the flow direction of the holes.

While in the first, second, third, fourth, and fifth embodiments AlInAs and InGaP are used as layers in which a spontaneous superlattice is formed, the present invention can be applied to III-V compound semiconductors such as GaInP, AlGaAs, AlGaInP, AlGaAsP, and the like including two or more Group III elements that are capable of forming a spontaneous superlattice. Even in this case, similar effects are obtained.

While in the first, second, third, fourth, and fifth embodiments an AlInAs layer or InGaP layer in which the spontaneous superlattice is formed are grown using gas source MBE, a growth method in which a spontaneous superlattice is formed, such as MOCVD (metal organic chemical vapor deposition), MBE (molecular beam epitaxy), and the like can be used to form layers such as AlInAs, InGaP, and the like, in which a spontaneous superlattice is present. Even in this case, similar effects can be obtained.

While in the first, second, third, fourth, and fifth embodiments a layer in which the spontaneous superlattice is formed is grown on a (100) surface, a layer in which the spontaneous superlattice is formed can be grown, in this invention, on a surface tilted several degrees from the (100) surface, if it is possible to form a spontaneous superlattice. Even in this case, similar effects can be obtained.

While in the first, second, third, fourth, and fifth embodiments the layer in which a spontaneous superlattice is formed is grown on the (100) surface, the layer in which the spontaneous superlattice is formed can be grown on a {100} surface which is equivalent to the (100) surface, {110} surface, or {111} surface. Even in this case, similar effects can be obtained.

What is claimed is:

1. A semiconductor device comprising:
a first semiconductor layer having a main surface;
a III-V compound semiconductor layer including at least two Group III elements and containing dopant impurities, having a surface, disposed on said main surface of said semiconductor layer, having a band gap energy smaller than that of said first semiconductor layer, and including a spontaneous superlattice;
a source electrode and a drain electrode disposed along a line in a periodic direction of said spontaneous superlattice on a surface parallel to said main surface of said first semiconductor layer within said III-V compound semiconductor layer, making ohmic contact with said III-V compound semiconductor layer;

a gate electrode disposed between said source electrode and said drain electrode on said surface of said III-V compound semiconductor layer; and an insulating film inserted between said gate electrode and said III-V compound semiconductor layer.

2. The semiconductor device of claim 1 wherein:

said first semiconductor layer comprises AlGaInP; and said III-V compound semiconductor layer comprises GaInP.

* * * * *

UNITED STATES PATENT AND TRADEMARK OFFICE
CERTIFICATE OF CORRRECTION

PATENT NO.   :  5,907,161
DATED        :  May 25, 1999
INVENTOR(S)  :  Ochi et al.

It is certified that error appears in the above-identified patent and that said Letters Patent is hereby corrected as shown below:

Title page, under item [56], insert the following:

OTHER ART (Including Arthur, Title, Date, Pertinent Pages, Etc.)

Kapon, "Quantum Wire Lasers", Proceedings of the IEEE, Volumn 80, Number 3, March 1992, pages 398-410

Signed and Sealed this

Fifth Day of December, 2000

Attest:

Q. TODD DICKINSON

Attesting Officer

Director of Patents and Trademarks